(12) United States Patent
Kim et al.

(10) Patent No.: US 7,622,323 B2
(45) Date of Patent: Nov. 24, 2009

(54) METHOD FOR INCREASING MOBILITY OF AN ORGANIC THIN FILM TRANSISTOR BY APPLICATION OF AN ELECTRIC FIELD

(75) Inventors: Chang Ju Kim, Anyang-si (KR); Eun Jeong Jeong, Seongnam-si (KR); Sang Yoon Lee, Seoul (KR); Bon Won Koo, Suwon-si (KR); Eun Kyung Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 11/196,382

(22) Filed: Aug. 4, 2005

(65) Prior Publication Data
US 2006/0177961 A1    Aug. 10, 2006

(30) Foreign Application Priority Data
Feb. 4, 2005    (KR) ............... 10-2005-0010782

(51) Int. Cl.
*H01L 51/40*    (2006.01)
(52) U.S. Cl. .................. 438/99; 438/17; 438/82; 438/149
(58) Field of Classification Search ............ 438/82, 438/99, 14, 17, 57, 149, 133–140; 257/E51.005
See application file for complete search history.

(56) References Cited

U.S. PATENT DOCUMENTS

| | | | | |
|---|---|---|---|---|
| 5,583,369 A | * | 12/1996 | Yamazaki et al. | 257/635 |
| 5,933,202 A | * | 8/1999 | Watanabe et al. | 349/33 |
| 5,981,970 A | * | 11/1999 | Dimitrakopoulos et al. | 257/40 |
| 6,232,157 B1 | | 5/2001 | Dodabalapur et al. | |
| 6,558,987 B2 | | 5/2003 | Lee | |
| 6,563,174 B2 | | 5/2003 | Kawasaki et al. | |
| 6,905,906 B2 | * | 6/2005 | Sirringhaus et al. | 438/99 |
| 7,113,241 B2 | * | 9/2006 | Hanaoka | 349/139 |

OTHER PUBLICATIONS

C.D. Dimitrakopoulos et al., "Low-Voltage Organic Transistors on Plastic Comprising High-Dielectric Constant Gate Insulators", Science, Feb. 5, 1999, pp. 822-824, vol. 283.
Dimitrakopoulos et al., Low-Voltage Organic Transistors on Plastic Comprising High-Dielectric Constant Gate Insulators, Science, 284(5403): 822-824 (1999)—Abstract Only.
Le Comber et al., Electronic Transport in Amorphous Silicon Films, Phys. Rev. Lett. 25, 509-511 (1970)—Abstract Only.

* cited by examiner

*Primary Examiner*—Michael S Lebentritt
*Assistant Examiner*—Daniel Whalen
(74) *Attorney, Agent, or Firm*—Harness, Dickey & Pierce, P.L.C.

(57) ABSTRACT

A method for fabricating an organic thin film transistor by application of an electric field. The method includes the steps of fabricating a common organic thin film transistor including a gate electrode, a gate insulating layer, an organic semiconductor layer and source/drain electrodes laminated on a substrate, and applying a direct current (DC) voltage to between the source and drain electrodes and applying an alternating current (AC) voltage to the gate electrode. The characteristics of an organic thin film transistor deteriorated after lamination of the respective layers can be recovered by the simple treatment. Therefore, the OTFT fabricated by the method has low threshold voltage, low driving voltage, high charge carrier mobility, and high $I_{on/Ioff}$ ratio.

6 Claims, 3 Drawing Sheets

US 7,622,323 B2

METHOD FOR INCREASING MOBILITY OF AN ORGANIC THIN FILM TRANSISTOR BY APPLICATION OF AN ELECTRIC FIELD

This non-provisional application claims priority under 35 U.S.C. § 119(a) on Korean Patent Application No. 2005-10782 filed on Feb. 4, 2005, which is herein expressly incorporated by reference.

BACKGROUND OF THE INVENTION

1. Field of the Invention

The embodiments of the present invention relate to a method for fabricating an organic thin film transistor (hereinafter, also referred to "OTFT") by application of an electric field, and more particularly to a method for fabricating an organic thin film transistor which comprises the steps of laminating a gate electrode, a gate insulating layer, an organic semiconductor layer and source/drain electrodes on a substrate, applying a direct current (DC) voltage to between the source and drain electrodes, and applying an alternating current (AC) voltage of various waveforms to the gate electrode.

2. Description of the Related Art

In general, thin film transistors (TFTs) currently used in displays consist mainly of an amorphous silicon semiconductor, a silicon oxide insulating film and metal electrodes. With the recent developments in various electrically conductive organic materials, a great deal of research around the world has focused on developing organic TFTs using organic semiconductors. Since organic thin film transistors (OTFTs) developed in the 1980's have advantages in terms of superior flexibility and ease of processing and fabrication, they are currently used in matrix display devices, such as liquid crystal displays (LCDs). Organic semiconductors as novel electronic materials are increasingly used in a wide variety of applications, e.g., functional electronic and optical devices, on account of their various synthetic processes, easy molding into fibers and films, superior flexibility, and low preparation costs. When compared to silicon transistors using amorphous Si, OTFTs using an organic semiconductor layer made of conductive organic molecules as a semiconductor have advantages in that the semiconductor layer can be formed by printing processes at ambient pressure, instead of conventional chemical vapor deposition (CVD) processes, such as plasma-enhanced chemical vapor deposition (CVD), and optionally, the overall fabrication procedure can be accomplished by roll-to-roll processes using plastic substrates.

Despite these advantages, OTFTs have problems of low charge carrier mobility, high driving voltage and high threshold voltage, when compared to amorphous silicon TFTs. Charge carrier mobility up to 0.6 cm$^2 \cdot$V$^{-1} \cdot$sec$^{-1}$ has recently been achieved in pentacene-based OTFTs, increasing the possibility of practical applications (N. Jackson, 54th Annual device Research Conference Digest 1996). However, the mobility is still unacceptable for practical TFT applications. In addition, drawbacks of the pentacene-based TFTs are a high driving voltage ($\geq$100V) and a high sub-threshold voltage 50 times than that of amorphous silicon TFTs.

On the other hand, U.S. Pat. No. 5,981,970 and *Science* (Vol. 283, pp 822-824) disclose organic thin film transistors with reduced driving voltage and threshold voltage using high dielectric constant ($\kappa$) insulating films. According to these publications, the gate insulting films are composed of inorganic metal oxides, such as Ba$_x$Sr$_{1-x}$TiO$_3$ (barium strontium titanate (BST)), Ta$_2$O$_5$, Y$_2$O$_3$, TiO$_2$, etc., and ferroelectric insulators, such as PbZr$_x$Ti$_{1-x}$O$_3$ (PZT), Bi$_4$Ti$_3$O$_{12}$, BaMgF$_4$, SrBi$_2$(Ta$_{1-x}$Nb$_x$)$_2$O$_9$, Ba(Zr$_{1-x}$Ti$_x$)O$_3$ (BZT), BaTiO$_3$, SrTiO$_3$, Bi$_4$Ti$_3$O$_{12}$, etc. In addition, the gate insulting films are formed by chemical vapor deposition, physical vapor deposition, sputtering, and sol-gel coating, and have a dielectric constant above 15. The lowest driving voltage of the OTFTs is reduced to $-5$V, but the highest charge carrier mobility is unsatisfactorily 0.06 cm$^2 \cdot$V$^{-1} \cdot$sec$^{-1}$. Furthermore, since most of the fabrication steps require a high temperature of 200-400° C., the range of applicable substrates is limited and common wet processes, such as simple coating and printing, cannot be easily applied to fabricate the OTFTs.

U.S. Pat. No. 6,232,157 suggests the use of polyimide, benzocyclobutene, photoacryls and the like as materials for organic insulating films. However, since these organic insulating films exhibit unsatisfactory device characteristics over inorganic insulating films, they are unsuitable to replace inorganic insulating films.

Attempts have been made to use multilayer gate insulating films in order to improve the performance of thin film electronic devices. For instance, U.S. Pat. No. 6,563,174 descries a multilayer gate insulating film consisting of two insulating films made of amorphous silicon nitride and silicon oxide, respectively, and U.S. Pat. No. 6,558,987 describes a double-layered insulating film consisting of two insulating films made of the same material. It is reported that these structures improve the electrical insulating properties and the crystalline quality of semiconductor layers. However, since both gate insulating films were developed only for amorphous silicon- and single crystal silicon-based inorganic TFTs and use inorganic materials, they are not suitable for use in the fabrication of organic semiconductors.

As the application of OTFTs has recently been extended not only to LCD displays but also to driving devices for flexible displays using an organic EL element, the OTFTs are required to have a high charge carrier mobility above 5 cm$^2 \cdot$V$^{-1} \cdot$sec$^{-1}$, low driving voltage and low threshold voltage, and to exhibit superior electrical insulating properties. Particularly, the fabrication of OTFTs involves a photoresist process for forming a pattern after deposition in order to form source/drain electrodes. At this time, an insulator layer underlying electrodes, in the case of bottom-contact OTFTs, or an organic semiconductor layer underlying electrodes, in the case of top-contact OTFTs, is exposed to a photoresist stripper, and as a result, nitrogen generated from the stripper is adsorbed to the surface of the gate insulating film or organic semiconductor layer, leading to a deterioration in the performance of the transistors.

There have been introduced some trials to reduce the damage to the surface of a gate insulating film. For example, the damaged surface of a gate insulating film is physically treated using inert gas plasma, or a self-assembled monolayer (SAM) is formed on the damaged gate insulating film. However, these trials are not efficient in that they need additional processes, e.g., a process for physically treating the damaged surface.

Thus, there is an urgent need to develop a method for fabricating an OTFT which enables recovery of damage caused during fabrication of an OTFT by simple treatment, thereby not only ensuring high charge carrier mobility, low driving voltage and low threshold voltage but also achieving formation an insulating film by common wet processes.

The present inventors have earnestly and intensively conducted research to satisfy the need, and as a result, have found that when an electric field is simply applied to source, drain and gate electrodes during fabrication of an OTFT using a polymer semiconductor by wet processes, the charge carrier mobility and on/off current ratio ($I_{on}/I_{off}$ ratio) of the OTFT are greatly improved, leading to an improvement in the performance of the OTFT. Embodiments of the present invention are based on this finding.

OBJECTS AND SUMMARY

Therefore, it is an object of the embodiments of the present invention to provide a method for fabricating an organic thin film transistor with improved performance by simple application of an electric field to source, drain and gate electrodes during fabrication.

It is another object of the embodiments of the present invention to provide an organic thin film transistor fabricated by the method.

In accordance with one aspect of the present invention there is provided a method for fabricating an organic thin film transistor by application of an electric field, comprising: fabricating a common organic thin film transistor including a gate electrode, a gate insulating layer, an organic semiconductor layer, and source/drain electrodes laminated on a substrate; and applying a direct current (DC) voltage to between the source and drain electrodes and applying an alternating current (AC) voltage to the gate electrode.

In accordance with another aspect of the present invention, there is provided an organic thin film transistor fabricated by a method according to the embodiments of the present invention.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE PREFERRED EMBODIMENTS

The embodiments of the present invention will now be described in more detail with reference to the accompanying drawings.

Figure 1:
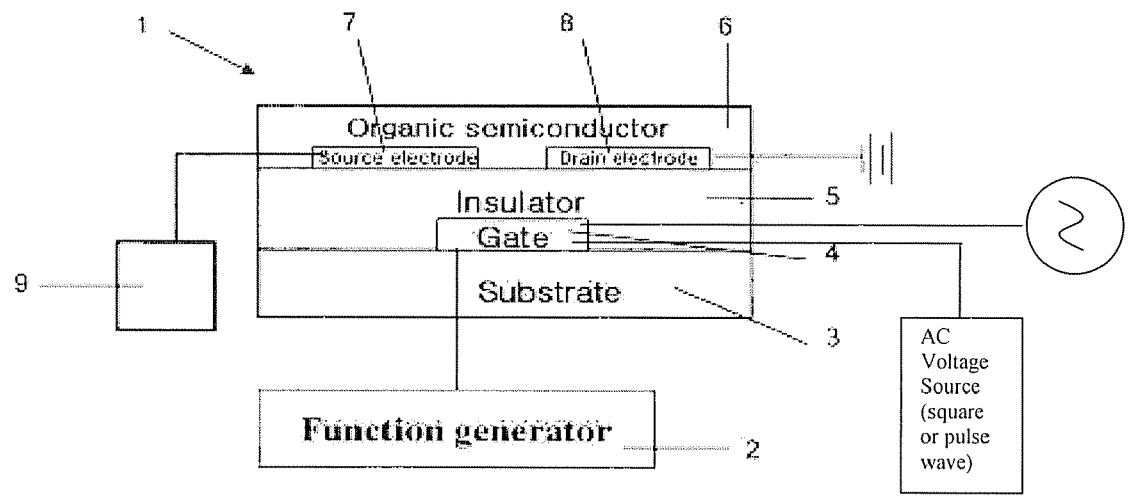
FIG. 1 is a schematic view showing a method for fabricating an organic thin film transistor according to one preferred embodiment of the present invention.

In accordance with one embodiment of the present invention shown in FIG. 1, a common bottom-contact organic thin film transistor 1 is fabricated by forming a gate electrode 4, a gate insulating layer 5, source and drain electrodes 7 and 8, and an organic semiconductor layer 6, in this order, on a substrate 3.

A method of the embodiments of the present invention is characterized in that constant voltages are applied to the common organic thin film transistor.

Specifically, a method of the embodiments of the present invention comprises, as shown in FIG. 1, applying a direct current (DC) voltage, from a DC voltage source 9, between source and drain electrodes 7 and 8 of the common organic thin film transistor 1, and applying an alternating current (AC) voltage, preferably from a function generator 2, to a gate electrode 4 of the transistor 1.

Hereinafter, a method of the embodiments of the present invention will be explained based on the respective fabrication steps of a bottom-contact organic thin film transistor, but it should be appreciated that the method can be applied to any structures of organic thin film transistors.

Step (i)

In this step, a substrate is washed to remove impurities by common techniques, and then a gate electrode is formed on the substrate by deposition or patterning.

Suitable materials for the gate electrode include a metal or an electrically conductive polymer commonly used in the art. Specific examples include, but are not limited to, gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures.

As a more specific example, a molybdenum (Mo)/tungsten (W) alloy is deposited on a glass substrate to a thickness of about 400 nm by sputtering, and is then patterned by photolithography to form a gate electrode.

Step (ii)

After the gate electrode is formed on the substrate in step (i), a gate insulating layer is formed thereon.

Examples of suitable materials for the gate insulating film include, but are not limited to, organic compounds, such as polyvinylphenols, polymethylmethacrylates, polyacrylates and polyvinylalcohols, and inorganic compounds, such as $SiN_x$ (0<x<4), $SiO_2$ and $Al_2O_3$. Further, maleimide copolymers and organic-inorganic hybrid compounds, which are known to improve the drawbacks of conventional organic or inorganic oxides, can be used as materials for the gate insulating film. For example, polyacryl polymers containing a crosslinking agent can be used.

The gate insulating layer can be formed by common wet processes, including but not limited to dip coating, spin coating, printing, spray coating, and roll coating.

The thickness of the gate insulating layer can be appropriately controlled, and is preferably in the range of from 7,000 Å to 8,000 Å. If needed, the gate insulating layer may be baked at about 150° C. to about 230° C. for 1 to 2 hours.

Step (iii)

In this step, source and drain electrodes are formed on the gate insulating film.

The source and drain electrodes can be made of the same materials as those for the gate electrode, for example, metals and electrically conductive polymers commonly used in the art. Specific examples include, but are not limited to, gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures.

Specifically, ITO is coated on the gate insulating film by thermal evaporation to form a thin film, and is then developed by exposing areas where source and drain electrodes are formed (or areas where the source and drain electrodes are not formed) to light through a shadow mask. Thereafter, etching is carried out using acetonitrile, etc., and a photoresist is removed using a photoresist stripper to form source/drain electrodes on the gate insulating film.

Step (iv)

After the source and drain electrodes are formed, an organic semiconductor material is coated thereon by common wet processes to form an organic semiconductor layer.

As materials for the organic semiconductor layer, there can be used already known polymer materials capable of being coated by wet processes, particularly, polythiophenes. Specific examples of such organic semiconductor materials include polythiophenes, polyanilines, polyacetylenes, polypyrroles, polyphenylene vinylenes, and derivatives thereof. Furthermore, there can be used poly(thiophene-arylene) and oligo(thiophene-arylene) derivatives in which an arylene having n-type semiconductor characteristics is introduced into a polythiophene having p-type semiconductor characteristics. At this time, the formation of the organic semiconductor layer can be carried out by wet processes, including but not limited to screen printing, printing, spin coating, dip coating, and ink spraying.

Step (v)

In this step, an electric field is applied to the common organic thin film transistor fabricated in step (iv).

First, a DC voltage is applied to between the source and drain electrodes of the common organic thin film transistor.

The intensity of the DC voltage applied to between the source and drain electrodes is not especially limited, and is preferably between −10V and −100V, which corresponds to that applied to drive common p-type OTFTs. More preferably, −20V DC is applied to between the source electrode and the drain electrodes.

Next, an AC voltage is applied to the gate electrode of the common organic thin film transistor preferably using a function generator.

It is preferable that the AC voltage applied to the gate electrode has an intensity of from 0.1V to 10V, and a frequency of from 10 Hz to 1 MHz. The intensity and frequency of the AC voltage applied in a method of the embodiments of the present invention are not particularly limited to the above-defined ranges. When the intensity and frequency are out of the upper limits, however, damage to the organic semiconductor and the insulating material can be caused by applied voltage having an excessive intensity and, thus, the desired effects may not be attained.

It is generally known that the interface between an organic semiconductor and an insulator plays an important role in determining the characteristics of an organic thin film transistor. This is because carriers (holes, in the case of a p-type organic thin film transistor, or electrons, in the case of an n-type organic thin film transistor) migrate at the organic semiconductor/insulator interface when OTFT channels are formed. It is also known that a large number of trap sites are present at the organic semiconductor/insulator interface (see, Science, Vol. 283, pp 822-824 and Physical Review Letter, Vol. 25, pp 509). Carriers migrate at the organic semiconductor/insulator interface through multiple trapping and release processes. The multiple trapping and release processes are associated with the frequency of a gate voltage. When a gate voltage is applied, the carriers move from the bulk of the organic semiconductor toward the organic semiconductor/insulator interface. At this time, the trapping and release processes more frequently take place due to the presence of trap sites at the interface. Since relaxation time is different in each process, all trap sites may be filled with the carriers at a characteristic frequency. In this case, since trap sites are no longer present, the carriers move more freely and thus a current flowing in OTFT channels increases. When a negative gate voltage of a square wave is applied, the carriers are trapped at the organic semiconductor/insulator interface. Then, when a positive gate voltage is applied, the trapped carriers are released. Oligomers show high charge carrier mobility based on the following series of phenomena. When a negative voltage is applied at a sufficiently low frequency, trapping of carriers proceeds up to a deep state. Before the carriers trapped in the deep state escape upon application of a positive voltage, a negative voltage is again applied. While the negative voltage is continuously applied, the number of carriers trapped in the trap sites increases and finally the carriers fill all trap sites, making it impossible to proceed with the trapping and release processes any longer. The complete filling of the trap sites allows the carriers to freely move at the interface, thus leading to an increase in the mobility of the carriers. In contrast, polymers do not show the above characteristics because they have largely different characteristic frequency values from those of oligomers.

There is no particular restriction as to the waveform of the applied AC voltage, and square wave, pulse wave and other waveforms are preferred.

The application of the voltages to the source, drain and gate electrodes is more preferably performed for one minute to one hour. If the application is performed for a time of less than one minute, improvement in the performance of the organic thin film transistor is often negligible. Meanwhile, if the application is performed for a time exceeding one hour, the characteristics of the organic semiconductor material and the insulating material are often deteriorated, causing poor performance of the organic thin film transistor.

The constitution and effects of the embodiments of the present invention will be described in more detail with reference to the following specific examples. However, these examples are given for the purpose of illustration and are not to be construed as limiting the scope of the invention.

EXAMPLE 1

First, a molybdenum (Mo)/tungsten (W) alloy was deposited on a washed glass substrate to a thickness of 400 nm by sputtering, and was then patterned by photolithography to form a gate electrode. A polyacryl polymer was spin-coated at 2,000 rpm on the resulting structure to a form 700 nm thick insulating layer, which was dried at 150° C. for one hour. Gold (Au) was deposited on the insulating layer to a thickness of 500 Å by sputtering to form source and drain electrodes, and then a a,a'-Dihexylsexithiophene was spin-coated at 100 rpm thereon to form an 80 nm thick organic semiconductor layer. The resulting structure was baked at 100° C. for one hour to fabricate an organic thin film transistor.

Figure 2:
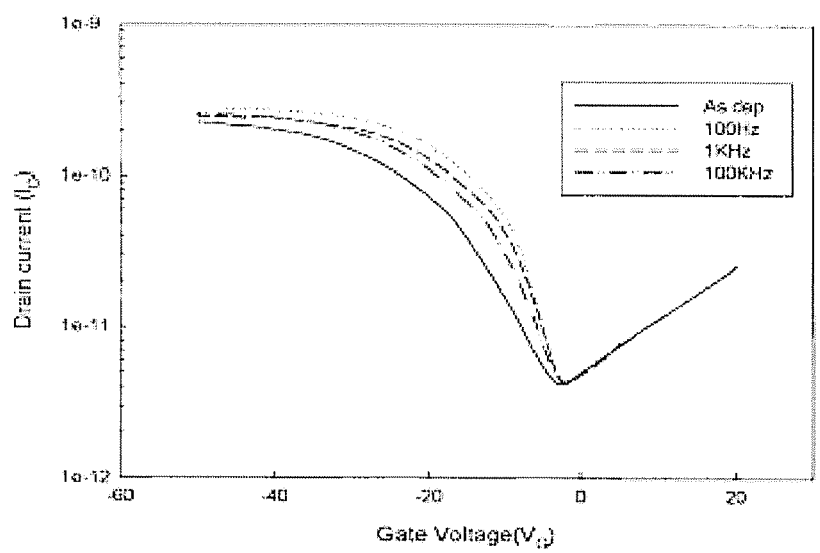
FIG. 2 is a graph showing changes in drain current according to the changes in the frequency of an AC voltage applied to a common organic thin film transistor fabricated in Example 1.

Thereafter, −20V was applied to between the source and drain electrodes. Subsequently, after the gate electrode was connected to a function generator (Agilent), 1 V AC of a square wave was applied to the gate electrode. Changes in drain current were measured according to the changes in the frequency (100 Hz, 1 KHz, and 100 kHz) of the applied AC voltage, and the results are shown in FIG. 2. Changes in threshold voltage were measured according to the changes in the frequency of the applied AC voltage, and the results are shown in Table 1 below.

TABLE 1

| Treatment conditions on gate electrode | Threshold voltage (V) |
| --- | --- |
| Before application of electric field | −15.9 |
| 100 Hz, 1 V AC applied | −9.1 |
| 1 KHz, 1 V AC applied | −10.2 |
| 100 KHz, 1 V AC applied | −12 |

Figure 3:
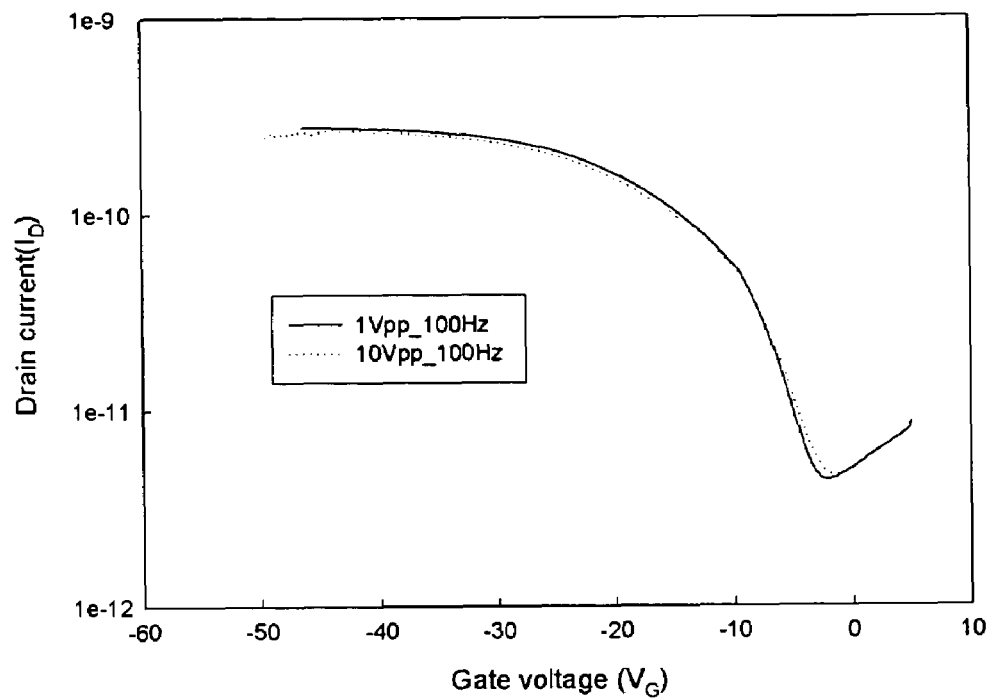
FIG. 3 is a graph showing changes in drain current according to the changes in the intensity of an AC voltage applied to a common organic thin film transistor fabricated in Example 1.

Changes in drain current according to the changes in the intensity of applied AC voltages (1V and 10V) were measured, and the results are shown in FIG. 3. At this time, the frequency was maintained at 100 Hz. The graphs shown in FIGS. 2 and 3 demonstrate that the dependence of the changes in drain current on the intensity of the applied AC voltages is weaker than that of the changes in drain current on the frequency of the applied AC voltage.

Figure 4:
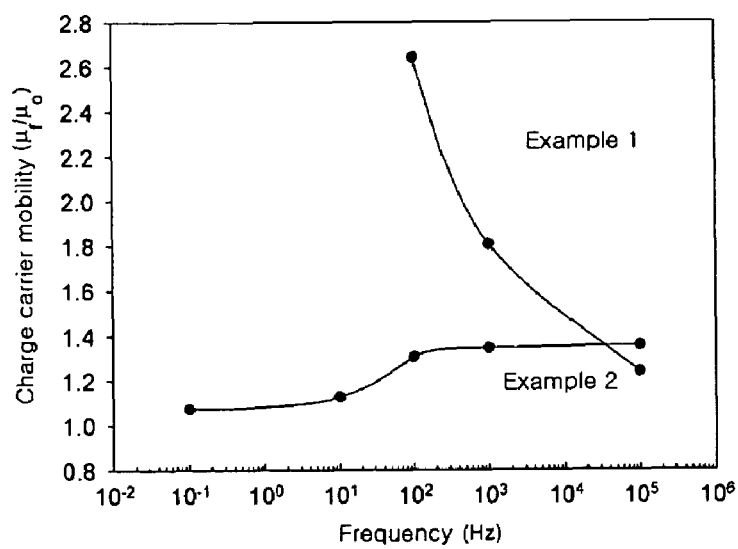
FIG. 4 is a graph showing the ratio between charge carrier mobility values measured before and after application of an electric field to common organic thin film transistors fabricated in Examples 1 and 2.

The changes in charge carrier mobility according to the changes in the frequency of the AC voltage applied to the gate electrode were calculated by the following equations, and the results are shown in FIG. 4. As the frequency of the voltage applied to the organic thin film transistor fabricated using the oligomer was reduced, the ratio between mobility values measured before and after application of the electric field was drastically increased.

*Charge Carrier Mobility and Threshold Voltage

*The charge carrier mobility was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$: source-drain current, $\mu$ and $\mu_{FET}$: charge carrier mobility, $C_O$: capacitance of insulating film, W: channel width, L: channel length, $V_G$: gate voltage, and $V_T$: threshold voltage.

$I_{on}/I_{off}$ ratio was determined from a ratio of a maximum current in the on-state to a minimum current in the off-state. $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$: maximum current, $I_{off}$: off-state leakage current, $\mu$: charge carrier mobility, $\sigma$: conductivity of thin film, q: electric charge, $N_A$: electric charge density, t: thickness of semiconductor film, $C_0$: capacitance of insulating film, and $V_D$: drain voltage.

As can be seen from this equation, the larger the dielectric constant and the smaller the thickness of the dielectric film, the larger the $I_{on}/I_{off}$ ratio. Therefore, the kind and thickness of the dielectric film are crucial factors in determining the $I_{on}/I_{off}$ ratio. The off-state leakage current ($I_{off}$) is a current flowing in the off-state, and was determined from the minimum current in the off-state.

EXAMPLE 2

First, a molybdenum (Mo)/tungsten (W) alloy was deposited on a washed glass substrate to a thickness of 400 nm by sputtering, and was then patterned by photolithography to form a gate electrode. A polyacryl polymer was spin-coated at 2,000 rpm on the resulting structure to form a 700 nm thick insulating layer, which was dried at 150° C. for one hour. Gold (Au) was deposited on the insulating layer to a thickness of 500 Å by sputtering to form source and drain electrodes, and then a poly(3-hexyl)thiophene was spin-coated at 100 rpm thereon to form an 80 nm thick organic semiconductor layer. The resulting structure was baked at 100° C. for one hour to fabricate an organic thin film transistor.

Figure 5:
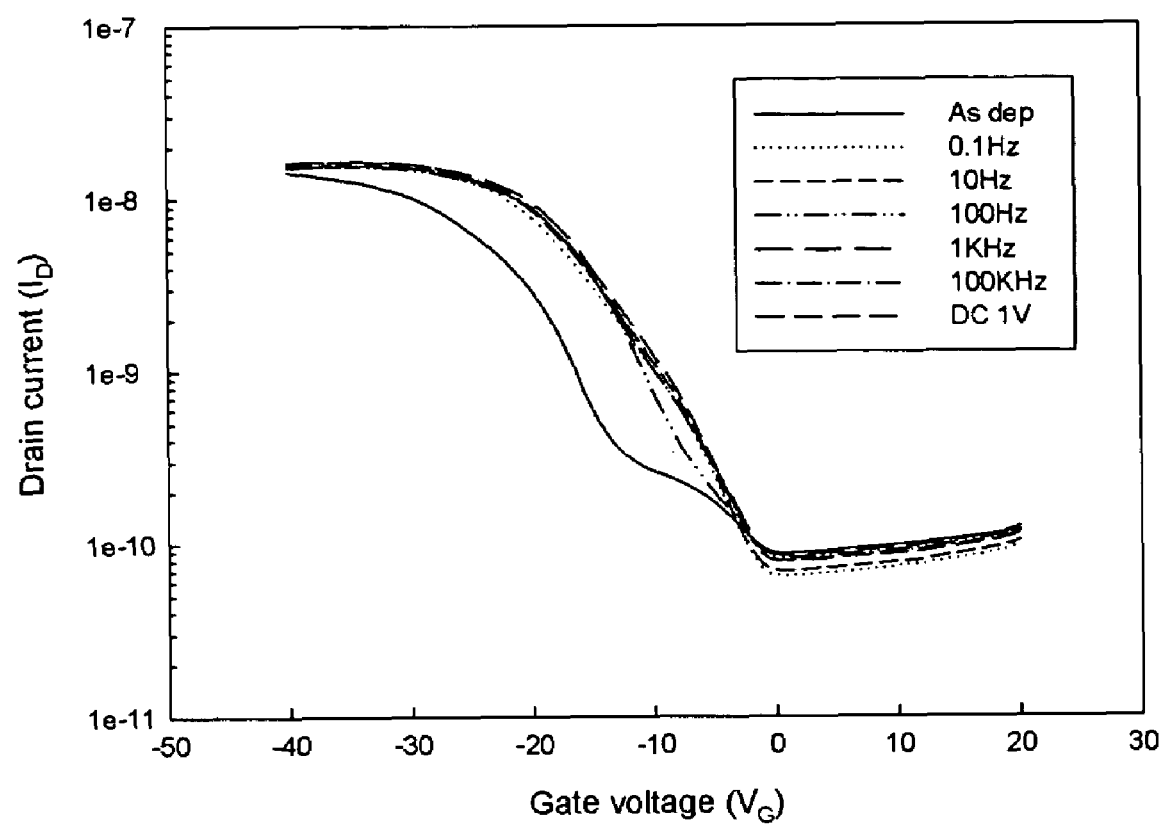
FIG. 5 is a graph showing the correlation between the changes in drain current and the changes in the frequency of an AC voltage applied to a common organic thin film transistor fabricated in Example 2.

Thereafter, −20 V was applied to between the source and drain electrodes. Subsequently, after the gate electrode was connected to a function generator (Agilent), 1 V AC of a square wave was applied to the gate electrode. Changes in drain current were measured according to the changes in the frequency (100 Hz, 1 KHz, and 100 kHz) of the applied AC voltage (1 V), and the results are shown in FIG. 5. The changes in charge carrier mobility according to the changes in the frequency of the AC voltage applied to the gate electrode were calculated, and the results are shown in FIG. 4. When the frequency of the voltage applied to the organic thin film transistor fabricated using the polymer was above 100 Hz, the ratio between mobility values measured before and after application of the electric field was slightly increased.

As can be seen from the results, since the OTFTs fabricated by a method of the embodiments of the present invention have high charge carrier mobility, low driving voltage and low threshold voltage while exhibiting superior electrical insulating properties, they are suitable as transistors for various electronic devices.

As apparent from the foregoing, according to a method of the embodiments of the present invention, since the characteristics of an organic semiconductor material deteriorated during fabrication can be recovered by simple application of an electric field, low threshold voltage, low driving voltage and high charge carrier mobility of the OTFT are ensured and the fabrication of the OTFT can be easily achieved by wet processes, contributing to the simplification of the fabrication processes and reduction in fabrication costs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for increasing mobility of an organic thin film transistor by application of an electric field, comprising the steps of:
    fabricating the organic thin film transistor comprising a gate electrode, a gate insulating layer, an organic semiconductor layer, and source/drain electrodes laminated on a substrate; and
    applying a direct current voltage between the source and drain electrodes and applying an alternating current voltage to the gate electrode, wherein the alternating current voltage applied to the gate electrode has a waveform and wherein the waveform is a square wave or a pulse wave, and wherein the direct current voltage applied between the source and drain electrodes has an intensity between −10 V and −100 V, wherein the alternating current voltage applied to the gate electrode has an intensity of from 0.1 V to 10 V, and a frequency of from 10 Hz to 1 MHZ, and wherein the application of the voltages is performed for one minute to one hour.

2. The method according to claim 1, wherein the organic semiconductor layer is formed by a wet process.

3. The method according to claim 1, wherein the gate insulating film is made of a material selected from the group consisting of polyvinylphenols, polymethylmethacrylates, polyacrylates, polyvinylalcohols, $SiN_x$ ($0 < x < 4$), $SiO_2$, $Al_2O_3$, and derivatives thereof.

4. The method according to claim 1, wherein the organic semiconductor layer is made of a material selected from the group consisting of polythiophenes, polyanilines, polyacetylenes, polypyrroles, polyphenylene vinylenes, and derivatives thereof.

5. The method according to claim 1, wherein the gate, source and drain electrodes are made of a material selected from the group consisting of gold, silver, aluminum, nickel, molybdenum, tungsten, indium-tin oxides, polythiophenes, polyanilines, polyacetylenes, polypyrroles, polyphenylene vinylenes, and polyethylenedioxythiophene/polystyrenesulfonate mixtures.

6. The method according to claim 1, wherein the substrate is made of a material selected from the group consisting of glass, silicon, and plastic.

* * * * *